(12) United States Patent
Chen

(10) Patent No.: US 8,102,702 B2
(45) Date of Patent: Jan. 24, 2012

(54) PHASE CHANGE MEMORY AND OPERATION METHOD OF THE SAME

(75) Inventor: Shih-Hung Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 197 days.

(21) Appl. No.: 12/545,294

(22) Filed: Aug. 21, 2009

(65) Prior Publication Data

US 2011/0044097 A1    Feb. 24, 2011

(51) Int. Cl.
*G11C 11/00* (2006.01)

(52) U.S. Cl. ..................... 365/163; 365/148

(58) Field of Classification Search ............ 365/163, 365/148
See application file for complete search history.

(56) References Cited

U.S. PATENT DOCUMENTS

| 7,564,710 B2 * | 7/2009 | Happ et al. .......... 365/163 |
| 7,656,701 B2 * | 2/2010 | Lee et al. ............ 365/163 |
| 2009/0161415 A1 | 6/2009 | Philipp et al. |

* cited by examiner

*Primary Examiner* — Huan Hoang
(74) *Attorney, Agent, or Firm* — J.C. Patents

(57) ABSTRACT

An operation method of phase change memory (PCM) is provided. The operation method includes applying a RESET pulse to a phase change material of the PCM, wherein the RESET pulse has a profile with a first tail such that a plurality of seeds are formed in the phase change material. Due to the design of the RESET pulse in the operation method, it can speed up the crystal process.

14 Claims, 6 Drawing Sheets

PHASE CHANGE MEMORY AND OPERATION METHOD OF THE SAME

BACKGROUND OF THE INVENTION

1. Field of the Invention

The present invention relates to a memory and operation method thereof; in particular, to a phase change memory (PCM) and operation method of the same.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

In detail, a PCM can be programmed and reprogrammed into high and low resistance states. When a phase change material is in the amorphous phase (known as the RESET state) it has high resistance; but when it is in the crystalline phase, it has low resistance (known as the set state). FIG. 1 shows the curves of voltage versus time for a RESET pulse and for a SET pulse in the PCM. As shown in FIG. 1, to ensure the "SET" programming in which the phase change material in the PCM will crystallize, the temperature is generally higher than the crystallization temperature and be held for a long time (t) to complete the process of SET the PCM. In other words, a long pulse should be used in the "SET program".

On the other hand, as shown in FIG. 1, for a "RESET program" in which the phase change material in the PCM is changed from a SET state to a RESET state, a higher voltage is applied into the phase change material for heating it above the melting temperature (Tm). In order to melt the phase change material and rapid quench down, a shorter and high-V pulse is used in the "RESET program".

However, for SET, a longer time is need to crystal the phase change material as shown in FIG. 1. Therefore, the write speed of the PCM will be lowered by the long SET time.

In view of the foregoing, there is a need for a method for accelerating the SET process in the PCM.

SUMMARY OF THE INVENTION

A PCM and operation method of the same are described herein, wherein the RESET pulse is designed to a profile with a tail such that the SET process can be sped up.

An operation method of a PCM is provided. The operation method includes applying a RESET pulse to a phase change material of the PCM, wherein the RESET pulse has a profile with a first tail such that a plurality of seeds are formed in the phase change material.

A PCM is further provided. The PCM includes a plurality of PCM cells and a controller configured to set a selected PCM cell to an amorphous state with a plurality of seeds by applying a RESET pulse to a phase change material of the selected PCM cell. The RESET pulse has a profile with a first tail.

An integrated circuit is further provided. The integrated circuit includes a PCM array, a word line decoder, a bit line decoder, a bias circuitry voltage and current sources, and a controller. The PCM array includes a plurality of PCM cells each containing a phase change material, wherein the PCM array is arranged in a plurality of rows defined by respective word lines and a plurality of columns defined by respective bit lines. The word line decoder is coupled to the respective word lines arranged along the plurality of rows in the PCM array, and the bit line decoder is coupled to the respective bit lines arranged along plurality of columns in the PCM array. The bias circuitry voltage and current sources is used for applying bias arrangements to the word lines and the bit lines. The controller is configured to set a selected PCM cell to an amorphous state with a plurality of seeds by controlling the bias circuitry voltage and current sources to apply a RESET pulse to the phase change material of the selected PCM cell, wherein the RESET pulse has a profile with a first tail.

Since the RESET pulse has a profile with a tail in the operation method of the PCM, the formation of a plurality of seeds in the phase change material of the PCM can be performed. Because of the formation of seeds, it can speed up the SET process, which is good for higher write data rate and achieve a higher endurance. In addition, the thermal stress can be reduced by shortening the duration of the SET process.

DESCRIPTION OF THE EMBODIMENTS

Reference will now be made in detail to the present preferred embodiments, examples of which are illustrated in the accompanying drawings. In the accompanying drawings, the sizes of different pulse profiles are exaggeratedly illustrated for easy understanding. Those devices on the substrate which are not illustrated are well-known to those having ordinary skill in the art, and therefore can be disposed according to the actual requirement for PCM. Various terms used in following description are only used for describing the embodiments but not for limiting the scope thereof.

Figure 2:
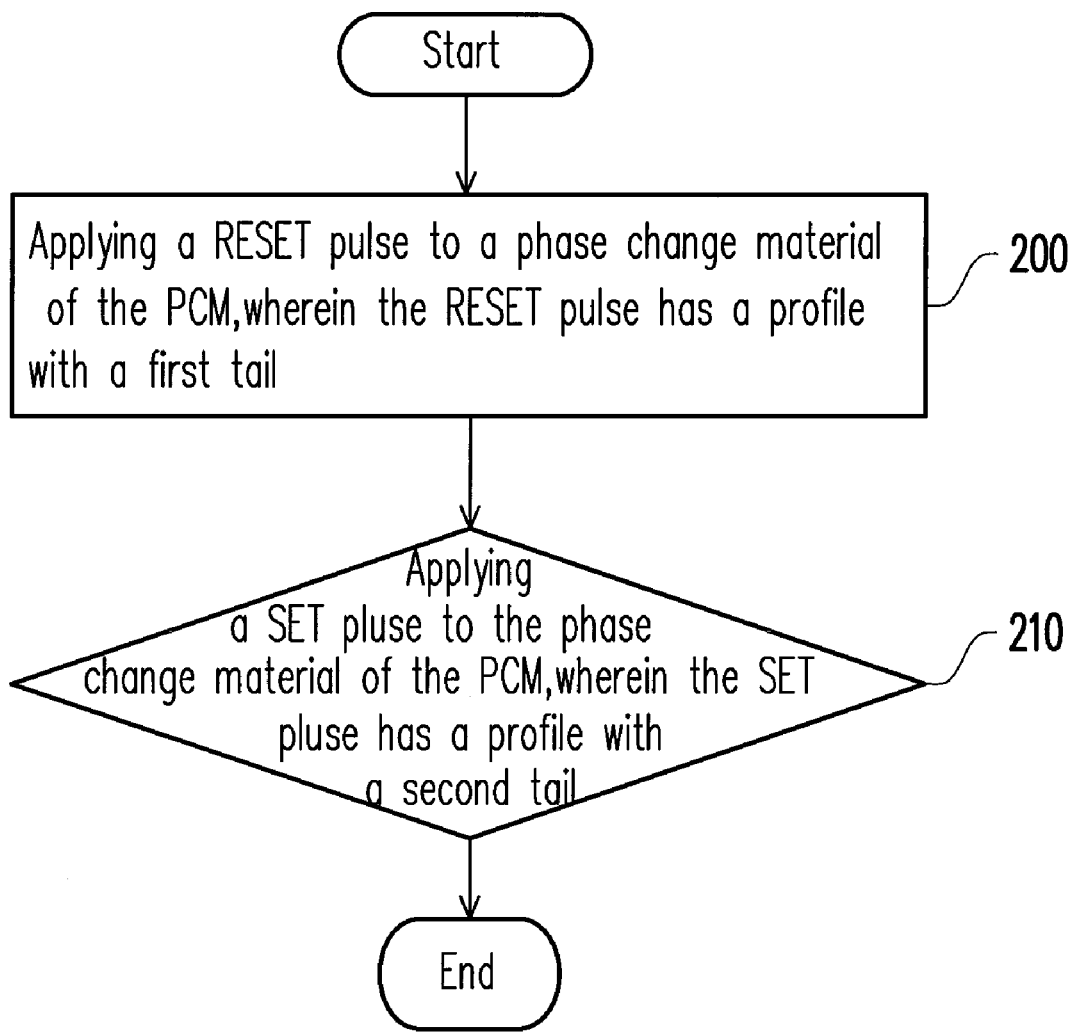
FIG. 2 is a flowchart illustrating an operation method of a PCM in accordance with one embodiment.

FIG. 2 is a flowchart illustrating an operation method of a PCM in accordance with one embodiment.

The operation method of the PCM will be described in detail with reference to FIG. 2. For a "RESET" program, a RESET pulse is applied to a phase change material of the PCM, wherein the RESET pulse has a profile with a first tail in step 200. After the step 200, seeds will be formed in the phase change material. Due to the formation of the seeds, the subsequent SET process will be sped up, which is good for higher write data rate and achieve a higher endurance.

Thereafter, a SET pulse is optionally applied to the phase change material of the PCM in step 210. Because the seeds are already formed in the phase change material after the step 200 and before the step 210, the time for crystallization by applying the SET pulse in the step 210 can be shortened substantially. Thus, the SET process may be accelerated, and consequently the duration of RESET and SET processes will be shortened. In addition, the thermal stress in the PCM can be reduced by shortening the SET time. In this embodiment, the SET pulse has a profile with a second tail. However, the SET pulse of the present invention is not limited hereby.

Figure 3:
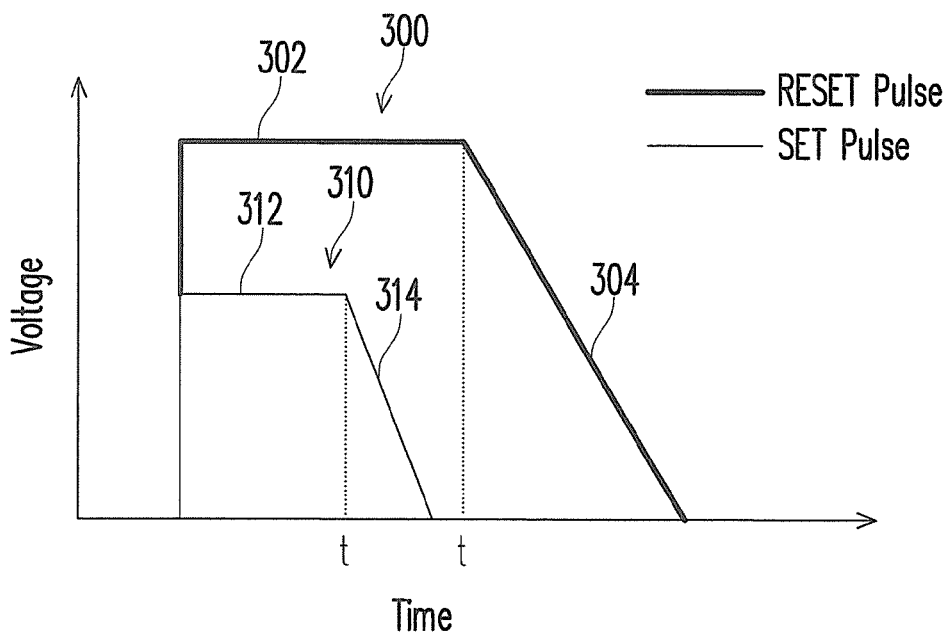
FIG. 3 illustrates curves of voltage versus time for the RESET pulse and for the SET pulse in accordance with one embodiment.
Figure 4:
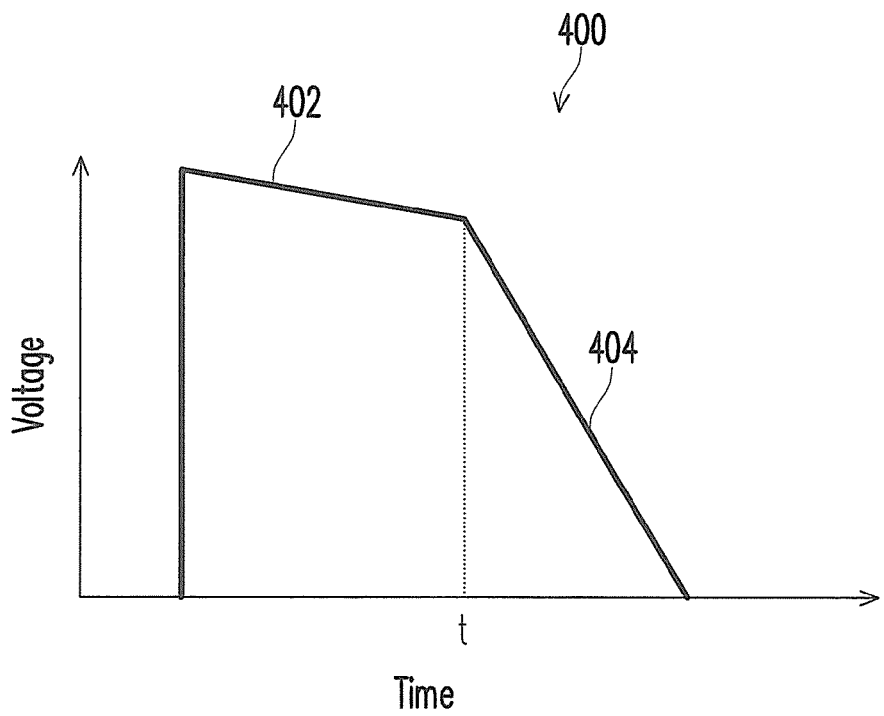
FIGS. 4-7 show various RESET pulse profiles in accordance with one or more embodiments.
Figure 5:
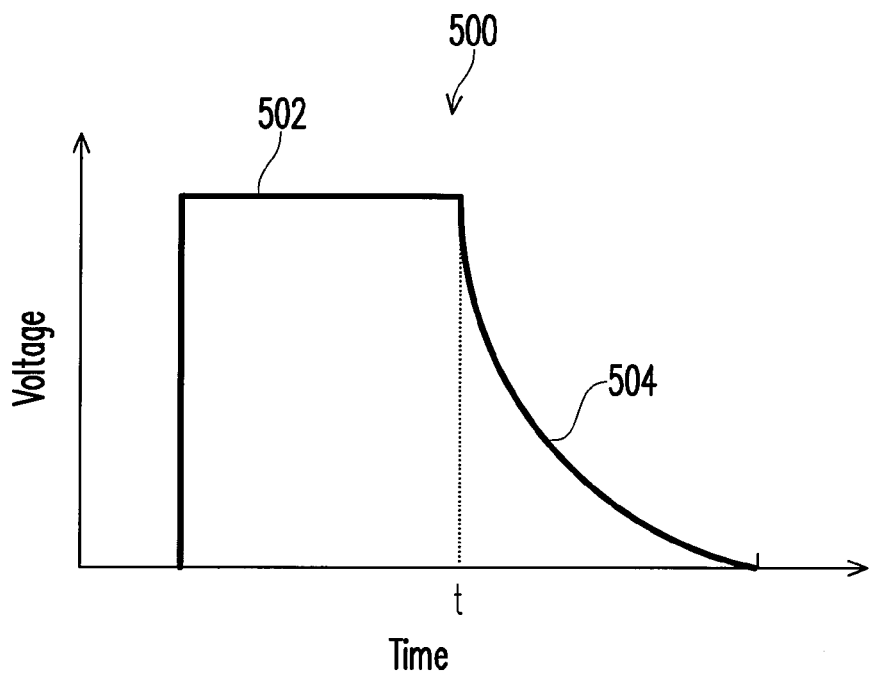
Figure 6:
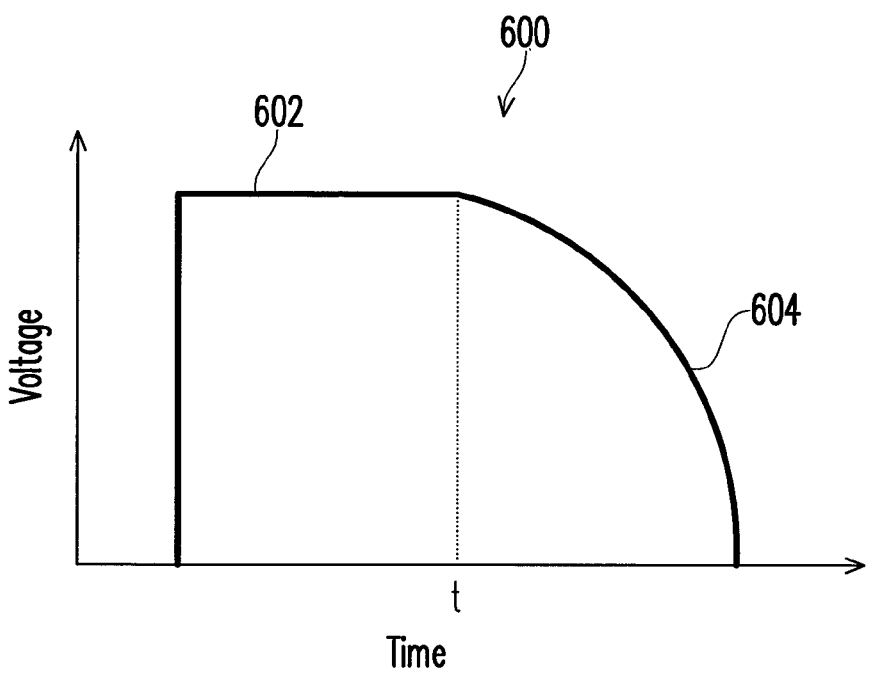
Figure 7:
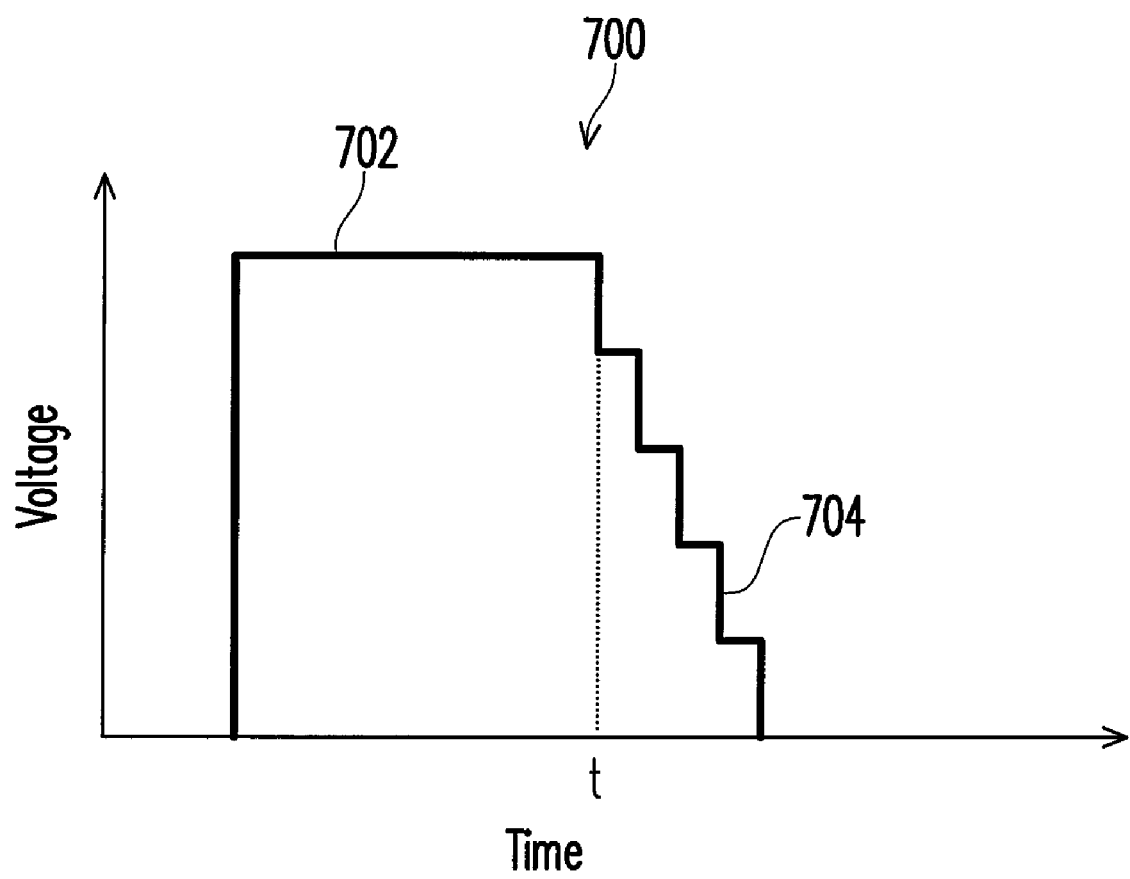

FIG. 3 illustrates curves of voltage versus time for the RESET pulse and for the SET pulse in FIG. 2.

Figure 1:
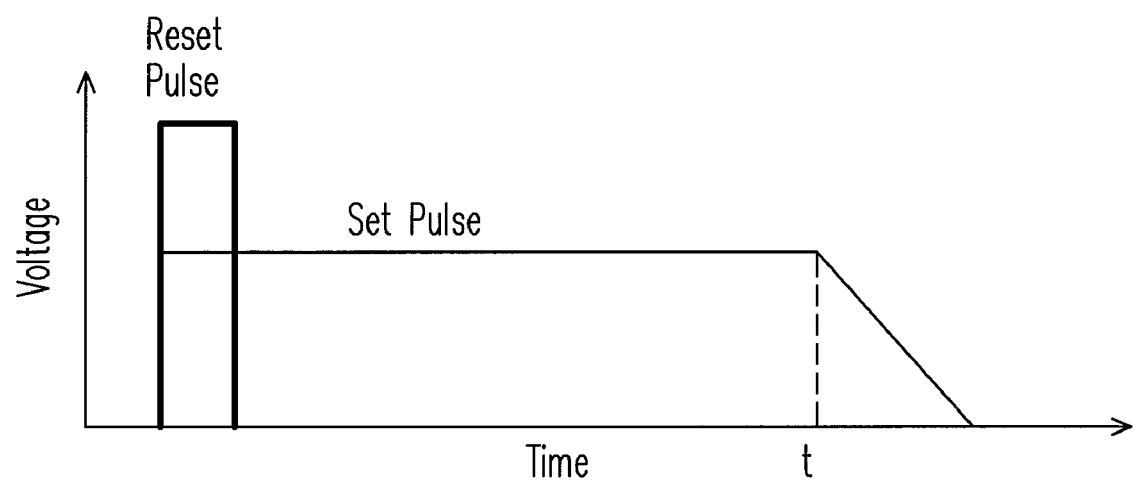
FIG. 1 illustrates curves of voltage versus time for a conventional RESET pulse and for a conventional SET pulse in the PCM.

Referring to FIG. 3, the profile of the RESET pulse 300 is a square 302 with the first tail 304 such as an oblique line, and the SET pulse 310 is a square 312 with the second tail 314. It should be understood that the vertical axis could also show the current, energy, heat, light or other type of energy of the SET pulse 310 and the RESET pulse 300. Moreover, the second tail 314, for example, is also an oblique line. In FIG. 3, the SET pulse 310 is far shorter than conventional SET pulse (Please refer to FIG. 1); indeed, the SET pulse 310 is shorter than the RESET pulse 300 in this embodiment. This design of RESET pulse can reduce the thermal stress by shortening the SET time, which is good for higher write data rate and achieve a higher endurance.

Regarding the RESET pulse in FIG. 3, various modifications can be made as following drawings.

FIGS. 4-7 show various RESET pulse profiles in accordance with one or more embodiments. The RESET pulse 400 in FIG. 4 has a profile of a trapezoid 402 with an oblique line 404. The RESET pulse 500 in FIG. 5 has a profile of a square 502 with a u-shaped curve 504. The RESET pulse 600 in FIG. 6 has a profile of a square 602 with a reverse u-shaped curve 604. The RESET pulse 700 in FIG. 7 has a profile of a square 702 with a stairs-like line 704. It should be understood that the RESET pulse could also combine the trapezoid 402 with the u-shaped curve 504, the reverse u-shaped curve 604, or the stairs-like line 704 according to the requirements for RESET program.

Figure 8:
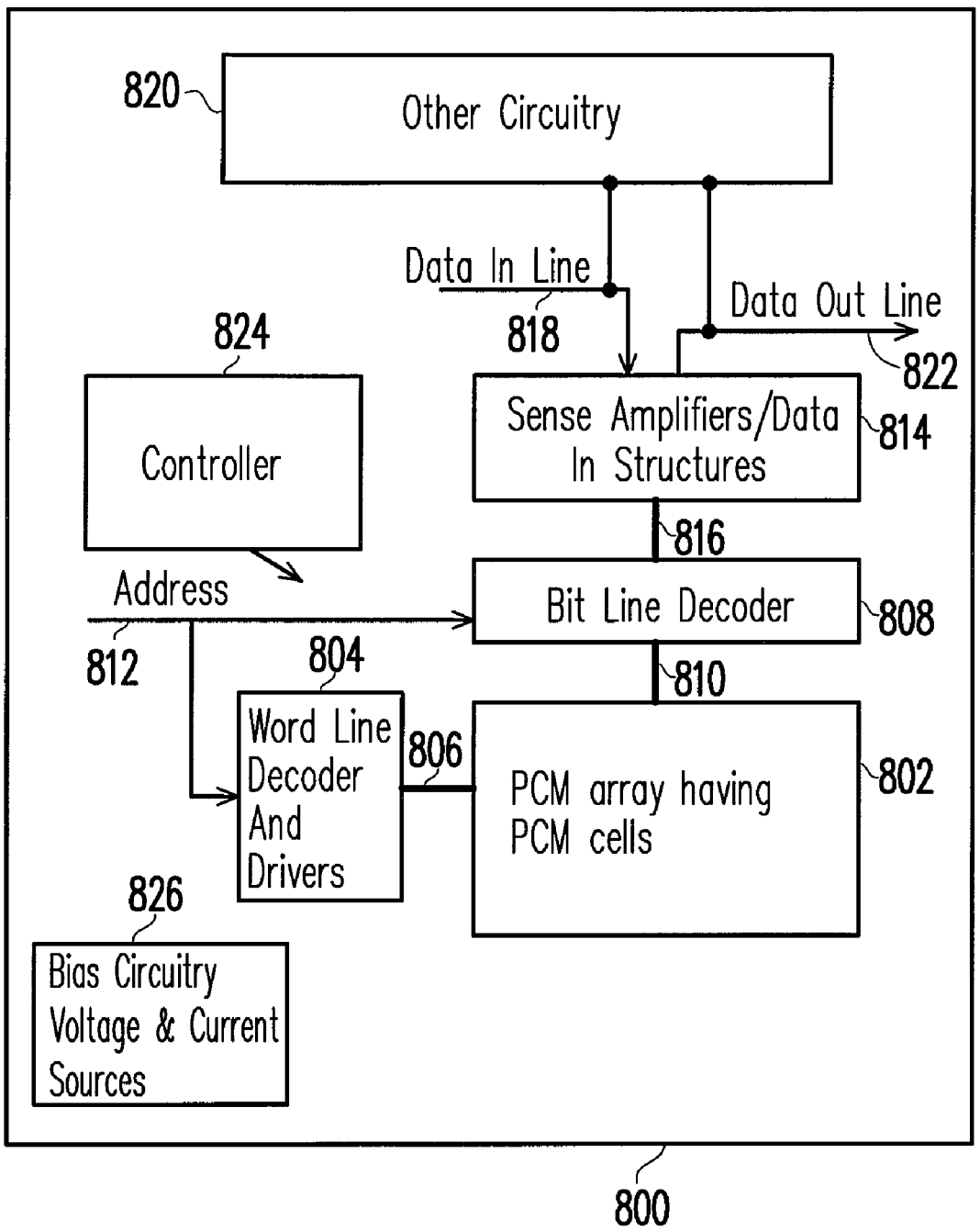
FIG. 8 is a block diagram illustrating one embodiment of a phase change memory (PCM).

FIG. 8 is a simplified block diagram of an integrated circuit 800 including a phase change memory (PCM) array 802.

Referring to FIG. 8, the PCM array 802 has PCM cells (not shown) which are programmable to plurality of resistance states including a lower resistance state and a higher resistance state. Each of PCM cells contains a phase change material (not shown). A word line decoder 804 having read, reset, reset verify, set verify and set modes is coupled to and in electrical communication with a plurality of word lines 806 arranged along rows in the PCM array 802. A bit line (column) decoder 808 is in electrical communication with a plurality of bit lines 810 arranged along columns in the array 802 for reading and programming the PCM cells (not shown) in array 802. Addresses are supplied on bus 812 to word line decoder and drivers 804 and bit line decoder 808. Sense circuitry (Sense amplifiers) and data-in structures in block 814 including voltage and/or current sources for the read and program modes are coupled to bit line decoder 808 via data bus 816. Data is supplied via a data-in line 818 from input/output ports on integrated circuit 800, or from other data sources internal or external to integrated circuit 800, to data-in structures in block 814. Other circuitry 820 may be included on integrated circuit 800, such as a general purpose processor or special purpose application circuitry, or a combination of modules providing system-on-a-chip functionality supported by array 802. Data is supplied via a data-out line 822 from the sense amplifiers in block 814 to input/output ports on integrated circuit 800, or to other data destinations internal or external to integrated circuit 800.

The integrated circuit 800 also includes a controller 824 for read, reset, reset verify, set verify, and set modes of the PCM cells of the array 802. The controller 824, implemented using a bias arrangement state machine, controls the application of bias circuitry voltage & current sources 826 for the application of bias arrangements including read, set and reset to the word lines 806, bit lines 810, and in some embodiments source lines, for example. In this embodiment, the controller 824 is configured to set a selected PCM cell to an amorphous state with seeds by controlling the bias circuitry voltage and current sources 826 to apply a RESET pulse having a profile with a first tail to the phase change material of the selected PCM cell. The RESET pulse, for example, has a profile as shown in one of FIGS. 3-7 or the like. In addition, the controller 824 is also configured to set the selected PCM cell to a crystalline state by applying a SET pulse to the phase change material. In one embodiment, the SET pulse is preferably shorter than the RESET pulse. The SET pulse has a profile with a second tail, and alternatively without tail.

In one embodiments, the controller 824 may be implemented using special-purpose logic circuitry as known in the art. In alternative embodiments, the controller 824 includes a general-purpose processor, which may be implemented on the same integrated circuit to execute a computer program to control the operations of selected PCM cell in the PCM array 802. In yet other embodiments, a combination of special-purpose logic circuitry and a general-purpose processor may be utilized for implementation of controller 824. In one embodiment, the PCM 800 includes a random access memory (RAM) such as a resistive RAM (RRAM), a DRAM, a SRAM or a NOR-type memory. In another embodiment, the PCM 800 includes an embedded memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operation method of a phase change memory (PCM), comprising:
    applying a RESET pulse to a phase change material of the PCM, wherein the RESET pulse has a profile with a first tail such that a plurality of seeds are formed in the phase change material; and
    applying a SET pulse to the phase change material of the PCM, wherein the SET pulse is shorter than the RESET pulse.

2. The operation method according to claim 1, wherein the profile of the RESET pulse comprises a square with the first tail, or a trapezoid with the first tail.

3. The operation method according to claim 1, wherein the first tail comprises an oblique line, a u-shaped curve, a reverse u-shaped curve, or a stairs-like line.

4. The operation method according to claim 1, wherein the SET pulse has a profile with a second tail.

5. A phase change memory (PCM), comprising:
    a plurality of PCM cells each comprises a phase change material; and
    a controller configured to set a selected PCM cell to an amorphous state with a plurality of seeds by applying a RESET pulse having a profile with a first tail to the phase change material of the selected PCM cell, and configured to set the selected PCM cell to a crystalline state by applying a SET pulse to the phase change material of the selected PCM cell, wherein the SET pulse is shorter than the RESET pulse.

6. The PCM according to claim 5, wherein the profile of the RESET pulse comprises a square with the first tail, or a trapezoid with the first tail.

7. The PCM according to claim 5, wherein the first tail comprises an oblique line, a u-shaped curve, a reverse u-shaped curve, or a stairs-like line.

8. The PCM according to claim 5, wherein the SET pulse has a profile with a second tail.

9. The PCM according to claim 5, wherein the PCM comprises a resistive random access memory (RRAM), a DRAM, a SRAM or a NOR-type memory.

10. The PCM according to claim 5, wherein the PCM comprises an embedded memory.

11. An integrated circuit, comprising:
a phase change memory (PCM) array, comprising a plurality of PCM cells each comprises a phase change material, wherein the PCM array is arranged in a plurality of rows defined by respective word lines and a plurality of columns defined by respective bit lines;
a word line decoder, coupled to the respective word lines arranged along the plurality of rows in the PCM array;
a bit line decoder, coupled to the respective bit lines arranged along plurality of columns in the PCM array;
a bias circuitry voltage and current sources, for applying bias arrangements to the word lines and the bit lines; and
a controller, configured to set a selected PCM cell to an amorphous state with a plurality of seeds by controlling the bias circuitry voltage and current sources to apply a RESET pulse having a profile with a first tail to the phase change material of the selected PCM cell, and configured to set the selected PCM cell to a crystalline state by applying a SET pulse to the phase change material of the selected PCM cell, wherein the SET pulse is shorter than the RESET pulse.

12. The integrated circuit according to claim 11, wherein the profile of the RESET pulse comprises a square with the first tail, or a trapezoid with the first tail.

13. The integrated circuit according to claim 11, wherein the first tail comprises an oblique line, a u-shaped curve, a reverse u-shaped curve, or a stairs-like line.

14. The integrated circuit according to claim 11, wherein the SET pulse has a profile with a second tail.

* * * * *